(12) United States Patent
Mitani

(10) Patent No.: US 11,587,812 B2
(45) Date of Patent: Feb. 21, 2023

(54) PROCESSING APPARATUS WITH ERECTED TUBE

(71) Applicant: DISCO CORPORATION, Tokyo (JP)

(72) Inventor: Shuzo Mitani, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/095,946

(22) Filed: Nov. 12, 2020

(65) Prior Publication Data

US 2021/0166963 A1 Jun. 3, 2021

(30) Foreign Application Priority Data

Dec. 3, 2019 (JP) .............................. JP2019-218981

(51) Int. Cl.
*H01L 21/677* (2006.01)
*H01L 21/67* (2006.01)

(52) U.S. Cl.
CPC .... *H01L 21/67733* (2013.01); *H01L 21/6773* (2013.01); *H01L 21/67772* (2013.01); *H01L 21/67775* (2013.01); *H01L 21/67092* (2013.01); *H01L 21/67712* (2013.01)

(58) Field of Classification Search
CPC ........... H01L 21/67733; H01L 21/6773; H01L 21/67772; H01L 21/67775; H01L 21/67712
See application file for complete search history.

(56) References Cited

U.S. PATENT DOCUMENTS

| 9,543,180 B2 * | 1/2017 | Kamiya ............ H01L 21/67201 |
| 2010/0204826 A1 * | 8/2010 | Sawado ............ H01L 21/67766 700/228 |
| 2010/0215461 A1 * | 8/2010 | Kamikawa ............ H01L 21/687 414/222.13 |
| 2019/0031440 A1 * | 1/2019 | Ito ......................... B65G 1/0464 |
| 2019/0164795 A1 * | 5/2019 | Motoori .............. H01L 21/6773 |
| 2020/0126823 A1 * | 4/2020 | Teramoto .......... H01L 21/67766 |

FOREIGN PATENT DOCUMENTS

JP 2007314331 A 12/2007

* cited by examiner

*Primary Examiner* — Gerald McClain
(74) *Attorney, Agent, or Firm* — Greer Burns & Crain Ltd.

(57) ABSTRACT

A processing apparatus includes a chuck table that holds a workpiece, a cutting unit that processes the workpiece held by the chuck table, a cassette placing region where a cassette is placed, a carrying unit that carries the workpiece between the cassette placed in the cassette placing region and the chuck table, and a surrounding wall that partitions a route for lifting the cassette upward and downward from an external space, in a space directly above the cassette placing region. A height of the surrounding wall is equal to or more than a height of a ceiling wall of the processing apparatus and is so as not to interfere with the cassette held by a carrier that travels.

2 Claims, 6 Drawing Sheets

PROCESSING APPARATUS WITH ERECTED TUBE

BACKGROUND OF THE INVENTION

Field of the Invention

The present invention relates to a processing apparatus.

Description of the Related Art

A facility such as a semiconductor device factory in which a workpiece to be processed by a plurality of processing apparatuses is carried by a carrier (ceiling carrier) to advance steps has been known (see, for example, Japanese Patent Laid-Open No. 2007-314331). The carrier is moved along a rail provided on a ceiling, carries a cassette accommodating a plurality of workpieces to a position directly above each processing apparatus, and lowers the cassette to a cassette placing region of each processing apparatus, to thereby put the workpiece into the processing apparatus.

SUMMARY OF THE INVENTION

In the facility described in Japanese Patent Laid-Open No. 2007-314331, in the case where an opening of the cassette being carried is exposed, there is a risk that the cassette may be inclined for some reason during lifting upward or downward and the workpiece may slip to drop from the cassette.

Accordingly, it is an object of the present invention to provide a processing apparatus in which it is possible to restrain a workpiece from dropping during when a cassette is lifted upward or downward.

In accordance with an aspect of the present invention, there is provided a processing apparatus to be disposed in a facility having a carrying system, the carrying system including a carrier traveling through a carrying passage disposed on a ceiling side, the carrier carrying a cassette that accommodates a workpiece, lifting the cassette upward and downward, placing the cassette on the processing apparatus to thereby carry the workpiece. The processing apparatus includes a chuck table that holds the workpiece, a processing unit that processes the workpiece held by the chuck table, a cassette placing region where the cassette is placed, a carrying unit that carries the workpiece between the cassette placed in the cassette placing region and the chuck table, and a surrounding wall that partitions a route for lifting the cassette upward and downward from an external space, in a space directly above the cassette placing region. A height of the surrounding wall is equal to or more than a height of the ceiling of the processing apparatus and is so as not to interfere with the cassette held by the carrier that travels.

Preferably, the surrounding wall includes an opening-closing door that permits an operator to enter the partitioned space.

The present invention produces an effect that the workpiece can be restrained from dropping during when the cassette is lifted upward or downward.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
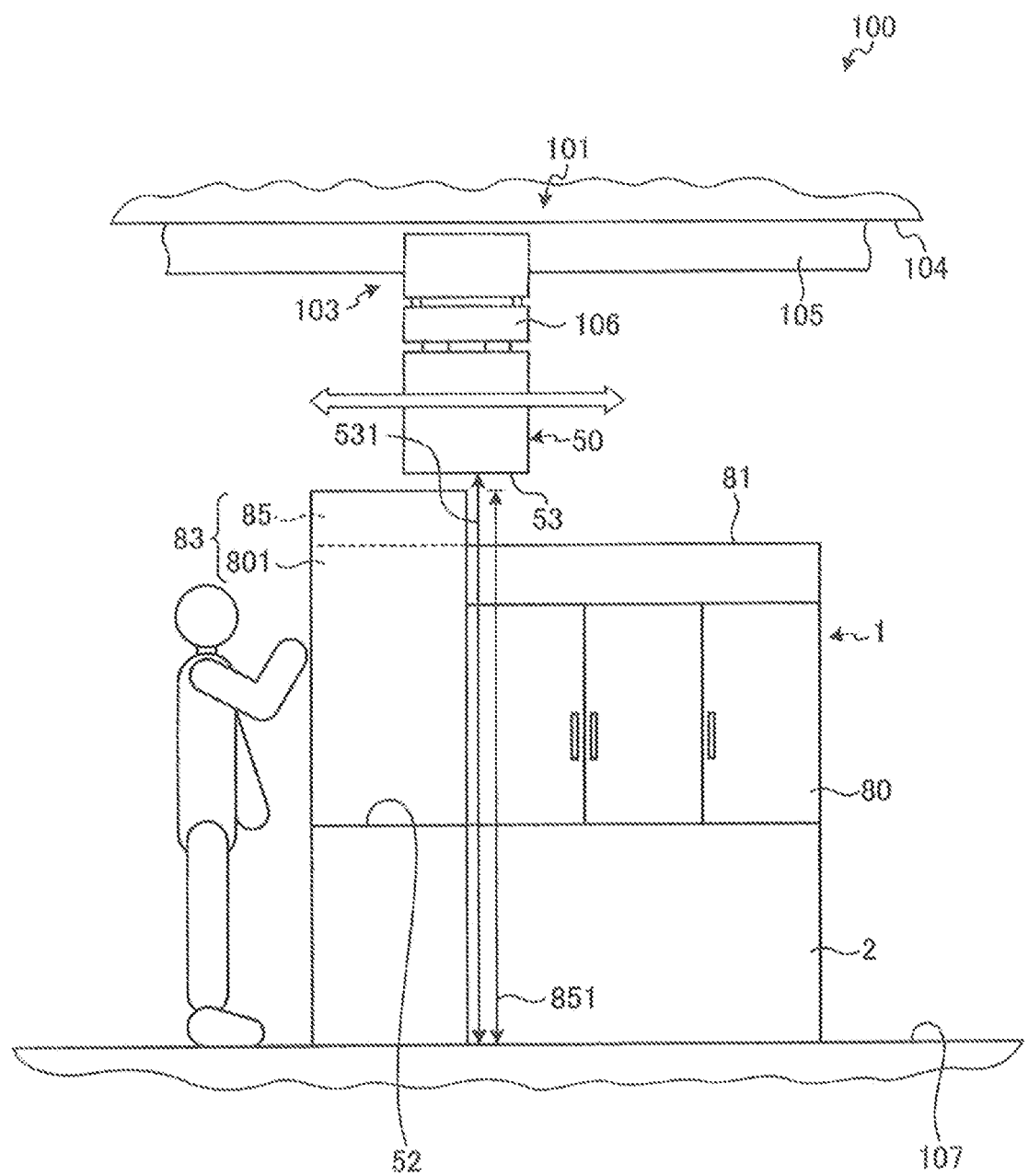
FIG. 1 is a side view depicting a configuration of a part of a factory facility where a processing apparatus according to a first embodiment of the present invention is installed.

An embodiment of the present invention will be described in detail below referring to the drawings. The present invention is not limited by the contents of the following description of the embodiment. In addition, the components described below include those which can be conceived by a person skilled in the art and substantially the same ones. Further, the configurations described below can be combined as required. Besides, various kinds of omission, replacement, or modification of the configuration are possible within such ranges as not to depart from the gist of the present invention.

First Embodiment

Figure 2:
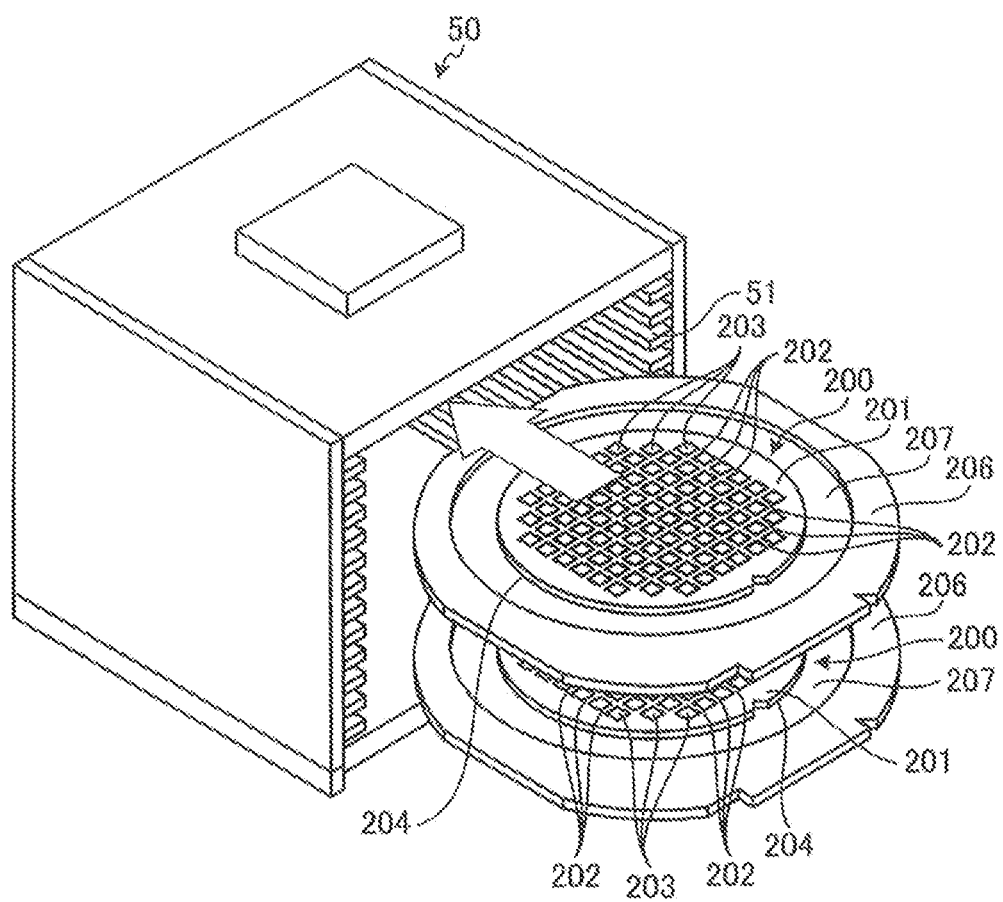
FIG. 2 is a perspective view depicting one example of a cassette carried by a carrying system of the factory facility illustrated in FIG. 1.
Figure 3:
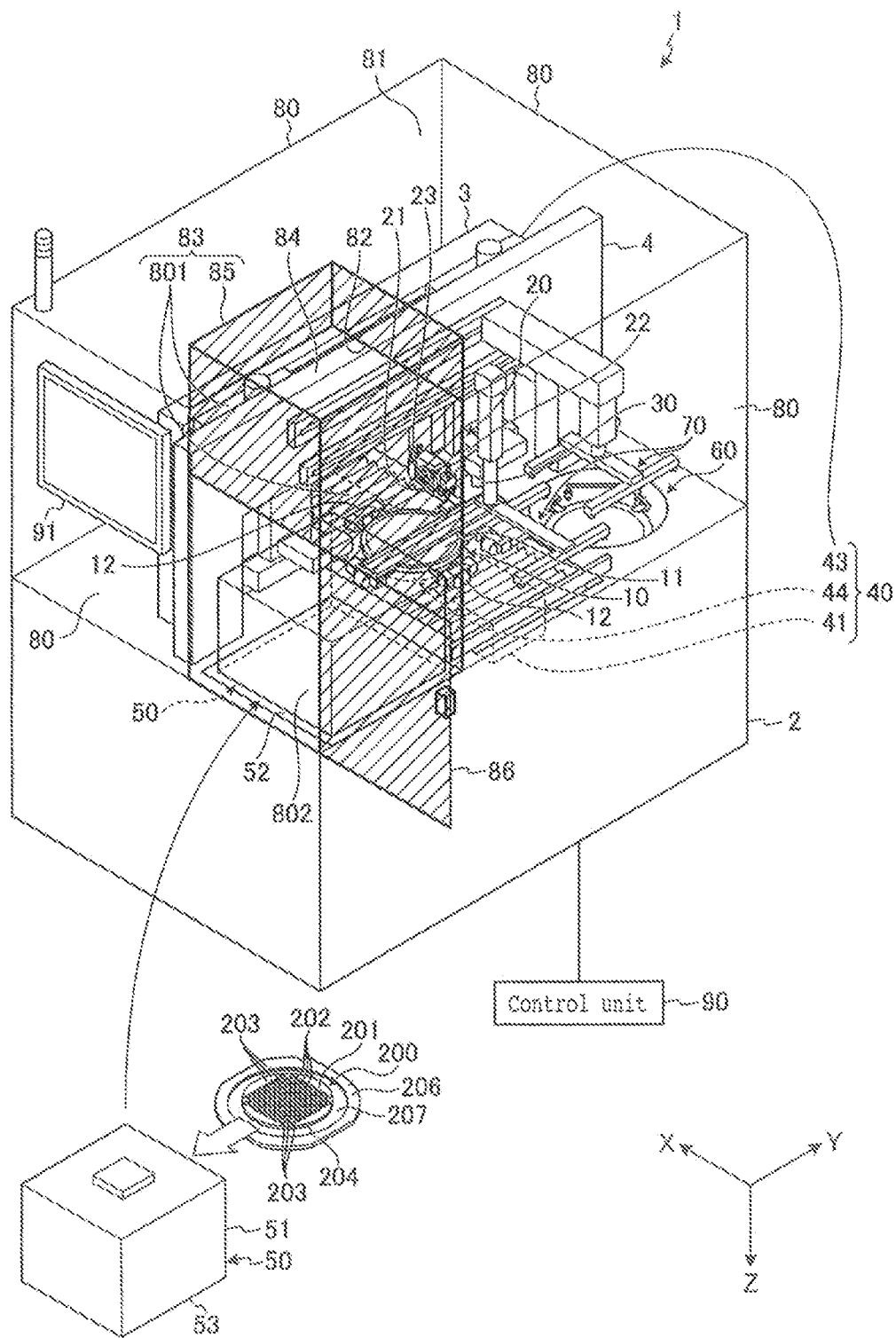
FIG. 3 is a perspective view depicting a configuration example of the processing apparatus according to the first embodiment.
Figure 4:
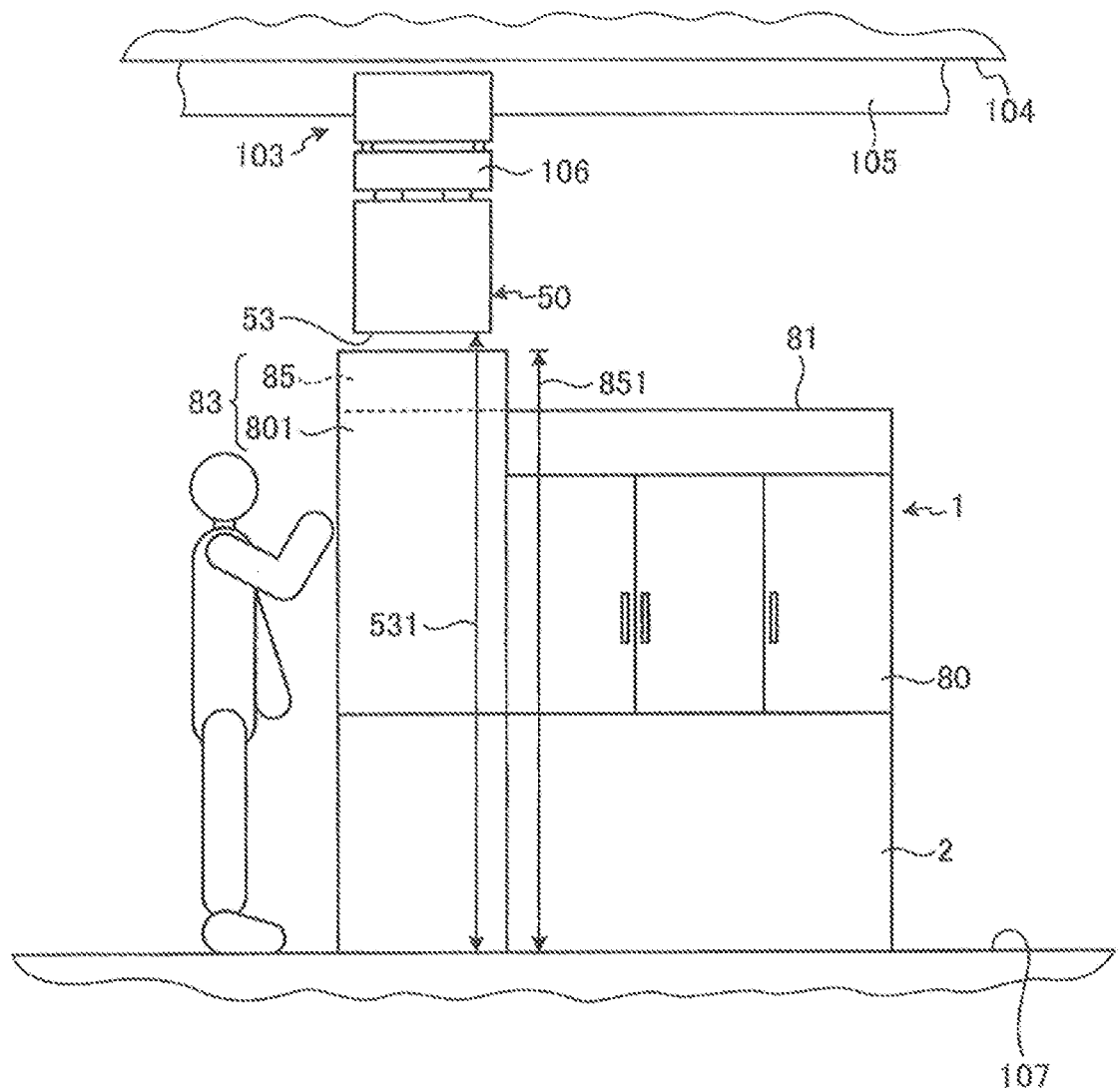
FIG. 4 is a side view depicting a state in which a cassette is located directly above a cassette placing region of the processing apparatus illustrated in FIG. 3.
Figure 5:
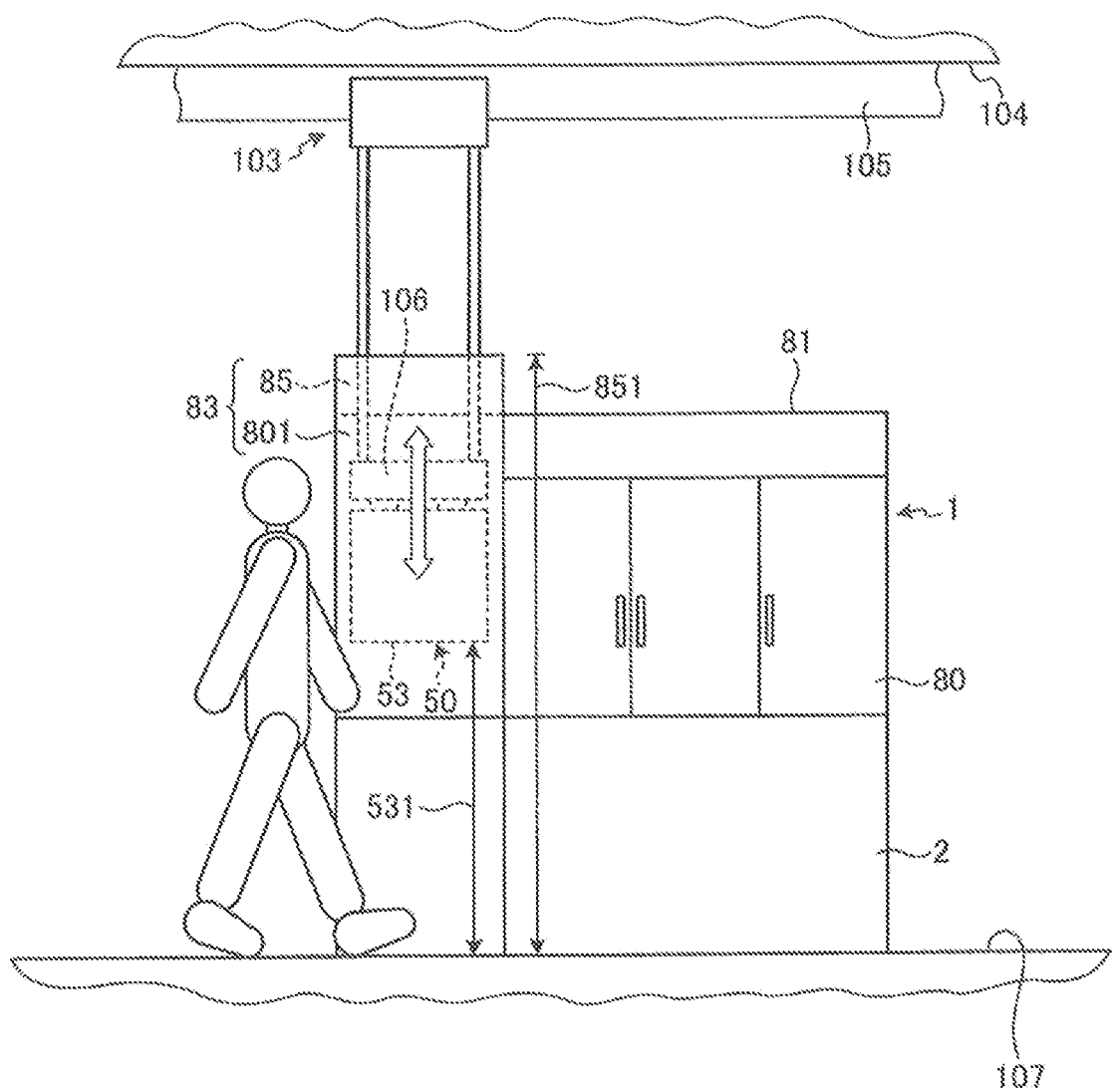
FIG. 5 is a side view depicting a state in which the cassette illustrated in FIG. 4 is lifted upward and downward.

A processing apparatus according to a first embodiment of the present invention will be described based on the drawings. FIG. 1 is a side view depicting a configuration of a part of a factory facility where the processing apparatus according to the first embodiment is installed. FIG. 2 is a perspective view depicting one example of a cassette carried by a carrying system in the factory facility illustrated in FIG. 1. FIG. 3 is a perspective view depicting a configuration example of the processing apparatus according to the first embodiment. FIG. 4 is a side view depicting a state in which a cassette is located directly above a cassette placing region of the processing apparatus illustrated in FIG. 3. FIG. 5 is a side view depicting a state in which the cassette illustrated in FIG. 4 is lifted upward and downward.

A processing apparatus 1 according to the first embodiment is installed in a factory facility 100 which is a facility depicted in FIG. 1. The factory facility 100 includes the processing apparatus 1 that processes a workpiece 200 (depicted in FIG. 2), and a carrying system 101 that carries the workpiece 200 between the processing apparatuses 1 or the like, as illustrated in FIG. 1. Note that the workpiece 200 as an object of processing in the factory facility 100 depicted in FIG. 1 is a wafer such as a disk-shaped semiconductor wafer or optical device wafer formed of silicon, sapphire, or gallium arsenide, as a substrate, as depicted in FIG. 2. The workpiece 200 is formed with devices 203 in regions partitioned in a grid pattern by a plurality of streets 202 formed in a grid pattern on a front surface 201 of the workpiece 200. The device 203 is, for example, an integrated circuit such as an integrated circuit (IC) or a large scale integration (LSI), or an image sensor such as a charge coupled device (CCD) or a complementary metal oxide semiconductor (CMOS).

In addition, the workpiece 200 in the present invention may be what is generally called a TAIKO (registered trademark) wafer which is thinned in a central portion thereof and is formed with a thick part at a peripheral portion thereof. Other than the wafers, the workpiece 200 may be a resin package substrate such as a rectangular quad flat no leaded (QFN) package substrate having a plurality of resin-sealed devices, a ceramic substrate, a ferrite substrate, a substrate including at least one of nickel and iron, or a glass substrate or the like.

In the first embodiment, an adhesive tape 207 in a disk shape of a diameter larger than an outside diameter of the workpiece 200 and accompanied by an annular frame 206 at a peripheral edge portion thereof is adhered to a back surface 204 on a back side of a front surface 201 of the workpiece 200, and the workpiece 200 is supported by the annular frame 206. In the first embodiment, a plurality of the workpieces 200 are accommodated in a cassette 50 in a state of each being supported by the annular frame 206.

The cassette 50 is an accommodating vessel that accommodates a plurality of the workpieces 200, and, in the first embodiment, it includes an opening 51 through which the workpiece 200 can horizontally be put into and out of the cassette 50. The cassette 50 accommodates the plurality of workpieces 200 at vertical intervals. In the first embodiment, the cassette 50 is what is generally called a frame cassette that accommodates a plurality of the workpieces 200 each supported on the annular frame 206.

In the first embodiment, the factory facility 100 is what is generally called a semiconductor device factory for processing the workpiece 200. In the factory facility 100, a plurality of processing apparatuses 1 are installed on a floor surface 107 or the like. Note that the processing apparatus 1 depicted in FIG. 1 is a cutting apparatus for cutting the workpiece 200 in the first embodiment, the processing apparatus 1 in the present invention is not limited to the cutting apparatus, and it is sufficient that the processing apparatus 1 is an apparatus for subjecting the workpiece 200 to various kinds of processing. For example, the processing apparatus 1 may be a laser processing apparatus for laser processing the workpiece 200, a grinding apparatus for grinding the workpiece 200, or a polishing apparatus for polishing the workpiece 200. Note that FIG. 1 illustrates only one processing apparatus 1, and the others are omitted.

The carrying system 101 includes an overhead hoist transfer (OHT; ceiling traveling type unmanned carrier) 103 as an automatic carrier, as depicted in FIG. 1.

The OHT 103 can travel along a rail 105 as a carrying passage installed on a ceiling 104 side of the factory facility 100, and the OHT 103 carries the cassette 50 by traveling along the rail 105. In addition, the OHT 103 includes a holding section 106 that holds the cassette 50 by suspending it, and a lift unit (not illustrated) that lifts the holding section 106 upward and downward. The OHT 103 is located directly above a cassette placing region 52 provided on an apparatus main body 2 of the processing apparatus 1, and the lift unit lifts the holding section 106 upward and downward to thereby carry the cassette 50 into and out of the processing apparatus 1. In addition, the OHT 103 travels along the rail 105, in a state in which the lift unit stops the holding section 106 holding the cassette 50 at a lifted-up position, thereby carrying the cassette 50 between the processing apparatuses 1.

Thus, the carrying system 101 carries the workpiece 200 by a process in which the OHT 103 traveling along the rail 105 carries the cassette 50 and the lift unit lifts the cassette 50 upward and downward to thereby place the cassette 50 on each processing apparatus 1. In addition, in the first embodiment, the cassette 50 is a cassette of a non-front opening unify pod (non-FOUP) type on which the opening 51 is exposed even during carrying by the carrying system 101.

The processing apparatus 1 illustrated in FIG. 3 is a cutting apparatus for cutting (corresponding to processing) the workpiece 200 along the streets 202 by holding the workpiece 200 by a chuck table 10. As depicted in FIG. 3, the processing apparatus 1 includes the chuck table 10 that holds under suction the workpiece 200 by a holding surface 11, a cutting unit 20 as a processing unit for cutting the workpiece 200 held on the chuck table 10 by a cutting blade 21, an imaging unit 30 for imaging the workpiece 200 held on the chuck table 10, and a control unit 90.

In addition, as depicted in FIG. 3, the processing apparatus 1 incudes a moving unit 40 that relatively move the chuck table 10 and the cutting unit 20. The moving unit 40 includes an X-axis moving unit 41 that puts the chuck table 10 into processing feeding in an X-axis direction parallel to a horizontal direction and a short direction of the apparatus main body 2, a Y-axis moving unit (not illustrated) that puts the cutting unit 20 into indexing feeding in a Y-axis direction parallel to a horizontal direction and a longitudinal direction of the apparatus main body 2 and orthogonal to the X-axis direction, a Z-axis moving unit 43 that puts the cutting unit 20 into cutting-in feeding in a Z-axis direction parallel to the vertical direction orthogonal to both the X-axis direction and the Y-axis direction, and a rotational moving unit 44 that rotates the chuck table 10 around an axis parallel to the Z-axis direction and that is put to processing feeding in the X-axis direction together with the chuck table 10 by the X-axis moving unit 41. As illustrated in FIG. 3, the processing apparatus 1 is a two-spindle dicer, or what is generally called a facing dual type cutting apparatus that includes two cutting units 20.

The X-axis moving unit 41 moves the chuck table 10 in the X-axis direction which is the processing feeding direction, thereby putting the chuck table 10 and the cutting unit 20 into relative processing feeding in the X-axis direction. The X-axis moving unit 41 moves the chuck table 10 in the X-axis direction, over a carrying-in/out region where the workpiece 200 is carried in and out and a processing region where the workpiece 200 held on the chuck table 10 is cut by the cutting unit 20.

The Y-axis moving unit moves the cutting unit 20 in the Y-axis direction which is the indexing feeding direction, thereby putting the chuck table 10 and the cutting unit 20 into relative indexing feeding in the Y-axis direction. The Z-axis moving unit 43 moves the cutting unit 20 in the Z-axis direction which is the cutting-in feeding direction, thereby putting the chuck table 10 and the cutting unit 20 into relative cutting-in feeding in the Z-axis direction.

The X-axis moving unit 41, the Y-axis moving unit, and the Z-axis moving unit 43 each include a known ball screw provided such as to be rotatable around an axis, a known motor that rotates the ball screw around the axis, and known guide rails that support the chuck table 10 or the cutting unit 20 such as to be movable in the X-axis direction, the Y-axis direction, or the Z-axis direction.

A shape of the chuck table 10 is a disk-like shape, and its holding surface 11 for holding the workpiece 200 is formed from a porous ceramic and the like. In addition, the chuck table 10 is freely moved in the X-axis direction over the carrying-in/out region and the processing region by the X-axis moving unit 41 and is freely rotated around an axis parallel to the Z-axis direction by the rotational moving unit 44. The chuck table 10 is connected to a vacuum suction source (not illustrated), and, by being sucked by the vacuum suction source, holds under suction the workpiece 200 placed on the holding surface 11. In the first embodiment, the chuck table 10 holds under suction the back surface 204 side of the workpiece 200 through the adhesive tape 207. Besides, as illustrated in FIG. 3, a plurality of clamp sections 12 for fixing the annular frame 206 are provided in the periphery of the chuck table 10.

The cutting unit 20 is cutting means in which the cutting blade 21 for cutting the workpiece 200 held on the chuck table 10 is detachably mounted. The cutting unit 20 is freely moved in the Y-axis direction by the Y-axis moving unit, and is freely moved in the Z-axis direction by the Z-axis moving unit 43, relative to the workpiece 200 held on the chuck table 10. Each of the cutting units 20 is supported by a gate-shaped support frame 3 erected from the apparatus main body 2 through the Y-axis moving unit, the Z-axis moving unit 43 and the like, as depicted in FIG. 3.

As illustrated in FIGS. 2 and 3, the cutting unit 20 includes the cutting blade 21, a spindle housing 22 freely moved in the Y-axis direction and the Z-axis direction by the Y-axis moving unit and the Z-axis moving unit 43, and a spindle 23 which is provided in the spindle housing 22 such as to be rotatable around an axis, is rotated by a motor (not illustrated) and has a tip end to which the cutting blade 21 is mounted.

The cutting blade 21 is an extremely thin cutting grindstone having a substantially ring-like shape. In the first embodiment, the cutting blade 21 is what is generally called a hub blade including an annular circular base, and an annular cutting edge disposed at a peripheral edge of the circular base for cutting the workpiece 200. The cutting edge 212 includes abrasive grains of diamond, cubic boron nitride (CBN) or the like and a bond material (binder) such as a metal or a resin, and is formed in a predetermined thickness. Note that, in the present invention, the cutting blade 21 may be what is generally called a washer blade including only a cutting edge. The cutting blade 21 is rotated by rotation of the spindle 23 around an axis by the motor. Note that the axes of the cutting blade 21 and the spindle 23 of the cutting unit 20 are parallel to the Y-axis direction.

The imaging unit 30 is fixed to the cutting unit 20 such as to be moved as one body with the cutting unit 20. The imaging unit 30 includes an imaging element for imaging a region to be divided of the workpiece 200 before cutting which is held on the chuck table 10. The imaging element is, for example, a CCD imaging element or a CMOS imaging element. The imaging unit 30 images the workpiece 200 held on the chuck table 10, to obtain an image for performing alignment for aligning the workpiece 200 and the cutting blade 21 and the like, and outputs the thus obtained image to the control unit 90.

In addition, the processing apparatus 1 includes an X-axis direction position detection unit (not illustrated) for detecting the position of the chuck table 10 in the X-axis direction, a Y-axis direction position detection unit (not illustrated) for detecting the position of the cutting unit 20 in the Y-axis direction, and a Z-axis direction position detection unit for detecting the position of the cutting unit 20 in the Z-axis direction. The X-axis direction position detection unit and the Y-axis direction position detection unit can include a linear scale parallel to the X-axis direction or the Y-axis direction and a reading head. The Z-axis direction position detection unit detects the position of the cutting unit 20 in the Z-axis direction, based on a pulsed current inputted to the motor. The X-axis direction position detection unit, the Y-axis direction position detection unit, and the Z-axis direction position detection unit output the position of the chuck table 10 in the X-axis direction and the position of the cutting unit 20 in the Y-axis direction or the Z-axis direction to the control unit 90. Note that, in the first embodiment, the positions of each component of the processing apparatus 1 in the X-axis direction, the Y-axis direction, and the Z-axis direction are determined with reference to predetermined reference positions (not illustrated).

Besides, the processing apparatus 1 includes a cassette placing region 52 where the cassette 50 accommodating the workpieces 200 before and after cutting is placed, a cleaning unit 60 for cleaning the workpiece 200 after cutting, and a carrying unit 70.

The cassette placing region 52 is disposed adjacent the Y-axis direction to the chuck table 10 positioned in the carrying-in/out region. In the cassette placing region 52, the cassette 50 is placed in such an orientation as to cause the opening 51 to face the chuck table 10 positioned in the carrying-in/out region. The cassette placing region 52 is lifted upward and downward along the Z-axis direction by a cassette elevator provided inside the apparatus main body 2. The cassette elevator lifts the cassette 50 placed in the cassette placing region 52 upward and downward along the Z-axis direction.

The cleaning unit 60 is disposed at a position which is adjacent in the Y-axis direction to the chuck table 10 positioned in the carrying-in/out region and at which the chuck table 10 in the carrying-in/out region is positioned between the cleaning unit 60 and the cassette placing region 52.

The carrying unit 70 carries the workpiece 200 between the cassette 50 placed in the cassette placing region 52 and the chuck table 10 positioned in the carrying-in/out region. The carrying unit 70 is supported such as to be freely movable in the Y-axis direction and to be freely liftable upward and downward in the Z-axis direction by a second support frame 4 erected from the apparatus main body 2. In the first embodiment, two carrying units 70 are provided. In the first embodiment, the carrying unit 70 takes out a single workpiece 200 from the cassette 50 and carries the workpiece 200 to the chuck table 10. The carrying unit 70 carries the workpiece 200 after cutting from the chuck table 10 to the cleaning unit 60 and accommodates the workpiece 200 after cleaning into the cassette 50.

In addition, the processing apparatus 1 includes a plurality of side walls 80 that are erected from an outer edge of the apparatus main body 2 and that surround the periphery of the chuck table 10, the cutting unit 20, the imaging unit 30, the moving unit 40, the cassette placing region 52, the cleaning unit 60, and the carrying unit 70, and a ceiling wall 81 continuous with upper ends of the plurality of side walls 80.

The control unit 90 controls each of the aforementioned units of the processing apparatus 1, to cause the processing apparatus 1 to perform a processing operation on the workpiece 200. Note that the control unit 90 is a computer including an arithmetic processing unit having a microprocessor such as a central processing unit (CPU), a storage unit having a memory such as a read only memory (ROM) or a random access memory (RAM), and an input-output interface unit. The arithmetic processing unit of the control unit 90 performs arithmetic processing according to a computer program stored in the storage unit, and control signals for controlling the processing apparatus 1 are outputted through the input-output interface unit to the aforementioned components of the processing apparatus 1.

Besides, the control unit 90 is connected to a display unit 91 including a liquid crystal display or the like for displaying the status of the processing operation and an image and the like, and an input unit used at a time when the operator registers processing contents information and the like. In the first embodiment, the display unit 91 is disposed on an outer surface of one side wall 80. The input unit includes at least one of a touch panel provided at the display unit 91, and an external input unit such as a keyboard.

In addition, the processing apparatus 1 includes a plurality of surrounding walls 83 (indicated by parallel oblique lines in FIG. 3). The surrounding walls 83 partition a route 84 along which the cassette 50 is lifted upward and downward, in a space directly above the cassette placing region 52, from a space outside of the walls 80 and 81 of the processing apparatus 1. Note that the route 84 is a space on an upper side from an upper surface of the cassette placing region 52 and includes a space inside of a ceiling opening 82 that penetrates the ceiling wall 81.

In an existing processing apparatus, the surrounding walls 83 have not been provided in the periphery of the ceiling opening 82 penetrating the ceiling wall 81, and, therefore, there has been a risk that the workpiece 200 may drop from the cassette 50 lifted upward and downward. In the processing apparatus 1 according to the first embodiment, on the other hand, the surrounding walls 83 are provided in the periphery of the ceiling opening 82 that penetrates the ceiling wall 81 and has not been surrounded. Note that the ceiling opening 82 penetrates the ceiling wall 81 such that the cassette 50 with the workpieces 200 accommodated therein can freely be put in and out therethrough, its plan-view shape is set larger than the plan-view shape of the cassette 50, and it is provided at a position directly above the cassette placing region 52 of the ceiling wall 81.

In the first embodiment, the surrounding walls 83 include one parts 801 of the two side walls 80 located adjacent to the cassette placing region 52 in the Y-axis direction and the X-axis direction of the plurality of side walls 80, and an erected tube 85 erected from an inner edge of the ceiling opening 82. The one parts 801 of the side walls 80 are those parts of the side walls 80 which are erected from the periphery of the cassette placing region 52. The erected tube 85 is erected from the inner edge of the ceiling opening 82, and, in the first embodiment, is formed in a tetragonal tubular shape. In the first embodiment, the one parts 801 of the side walls 80 and the erected tube 85 are flush and continuous with each other. In addition, a height 851 of an upper end of the erected tube 85 from the floor surface 107 is lower than a height 531 from the floor surface 107 of a lower surface 53 of the cassette 50 held by the holding section 106 of the OHT 103 located on an upper side and traveling along the rail 105, as depicted in FIG. 1. Thus, the height 851 of the surrounding walls 83 is equal to or more than the height of the ceiling wall 81 of the processing apparatus 1 and is a height so as not to interfere with the cassette 50 held by the traveling OHT 103 (lower than the lower surface 53 of the cassette 50).

In addition, the surrounding walls 83 include an opening-closing door 86. In the first embodiment, the opening-closing door 86 is attached to the side walls 80 such that an opening 802 provided in one of the one parts 801 of the two side walls 80 located adjacent to each other in the X-axis direction can freely be opened and closed. In the first embodiment, the opening-closing door 86 is supported by the side walls 80 such that one end thereof in a width direction can freely be rotated around an axis parallel to the Z-axis direction. With the one end in the width direction rotated around the axis parallel to the Z-axis direction, the opening-closing door 86 opens and closes the opening 802. In the case of performing a work on the cassette 50 or the workpiece 200 accommodated in the cassette 50 other than at a time of carrying the OHT 103, when the opening-closing door 86 opens the opening 802, the operator is permitted to enter the space partitioned by the surrounding walls 83 through the opening 802, and the cassette 50 can freely be put into and out of the cassette placing region 52 through the opening 802.

The processing apparatus 1 configured as above starts a processing operation when a central control unit connected to the processing apparatus 1 or the operator or the like registers processing contents information on the control unit 90, the cassette 50 accommodating the workpieces 200 is placed in the cassette placing region 52, and an instruction to start the processing operation from the central control unit connected to the processing apparatus 1 or the operator or the like is accepted by the control unit 90. When the processing operation is started, the processing apparatus 1 rotates the spindle 23 around an axis, the carrying unit 70 takes out a single workpiece 200 from the inside of the cassette 50, and places the back surface 204 side on the holding surface 11 of the chuck table 10 through the adhesive tape 207.

The processing apparatus 1 holds under suction the workpiece 200 on the holding surface 11 through the adhesive tape 207 and clamps the annular frame 206 by the clamp sections 12. The processing apparatus 1 moves the chuck table 10 to a position under the imaging unit 30 by the moving unit 40, images the workpiece 200 held under suction on the chuck table 10 by the imaging unit 30, and performs alignment.

The processing apparatus 1, while relatively moving the cutting blade 21 and the workpiece 200 along the street 202 by the moving unit 40 based on the processing contents information, causes the cutting blade 21 to cut into the street 202 of the workpiece 200 until reaching the adhesive tape 207, thereby cutting. After all the streets 202 of the workpiece 200 are cut, the processing apparatus 1 carries the workpiece 200 to the cleaning unit 60 by the carrying unit 70, and, after cleaning the workpiece 200 by the cleaning unit 60, carries the workpiece 200 into the cassette 50 by the carrying unit 70. The processing apparatus 1 sequentially cuts the workpieces 200 in the cassette 50 one by one. When all the workpieces 200 in the cassette 50 are cut, the processing apparatus 1 finishes the processing operation.

In addition, in the processing apparatus 1, when the cassette 50 is carried into the cassette placing region 52, the cassette 50 carried by the OHT 103 is positioned directly above the cassette placing region 52, as depicted in FIG. 4. In the processing apparatus 1, the lift unit of the OHT 103 lowers the holding section 106 through the inside of the surrounding walls 83 as depicted in FIG. 5, whereby the cassette 50 is placed in the cassette placing region 52. The processing apparatus 1 starts the aforementioned processing operation after the holding of the cassette 50 by the holding section 106 of the OHT 103 is released and the holding section 106 is raised. Besides, in the processing apparatus 1, the cassette 50 is carried out by an operation reverse to that at the time of carrying in.

As has been described above, since the processing apparatus 1 according to the first embodiment includes the surrounding walls 83 that partition the route 84 along which the cassette 50 is lifted upward and downward from the external space, the cassette 50 lifted upward and downward inside the route 84 is covered by the surrounding walls 83. Therefore, the processing apparatus 1 can support by the surrounding walls 83 the workpiece 200 that tends to drop to the outside of the cassette 50 through the opening 51. As a result, the processing apparatus 1 produces an effect that dropping of the workpiece 200 can be restrained at the time when the cassette 50 is lifted upward or downward.

Besides, in the processing apparatus 1 according to the first embodiment, the height 851 of the surrounding walls 83 is equal to or more than the height of the ceiling wall 81 of the processing apparatus 1 and is lower than the height 531 of the lower surface 53 of the cassette 50 held by the traveling OHT 103, and, therefore, the cassette 50 can securely be carried in and out by the OHT 103.

Figure 6:
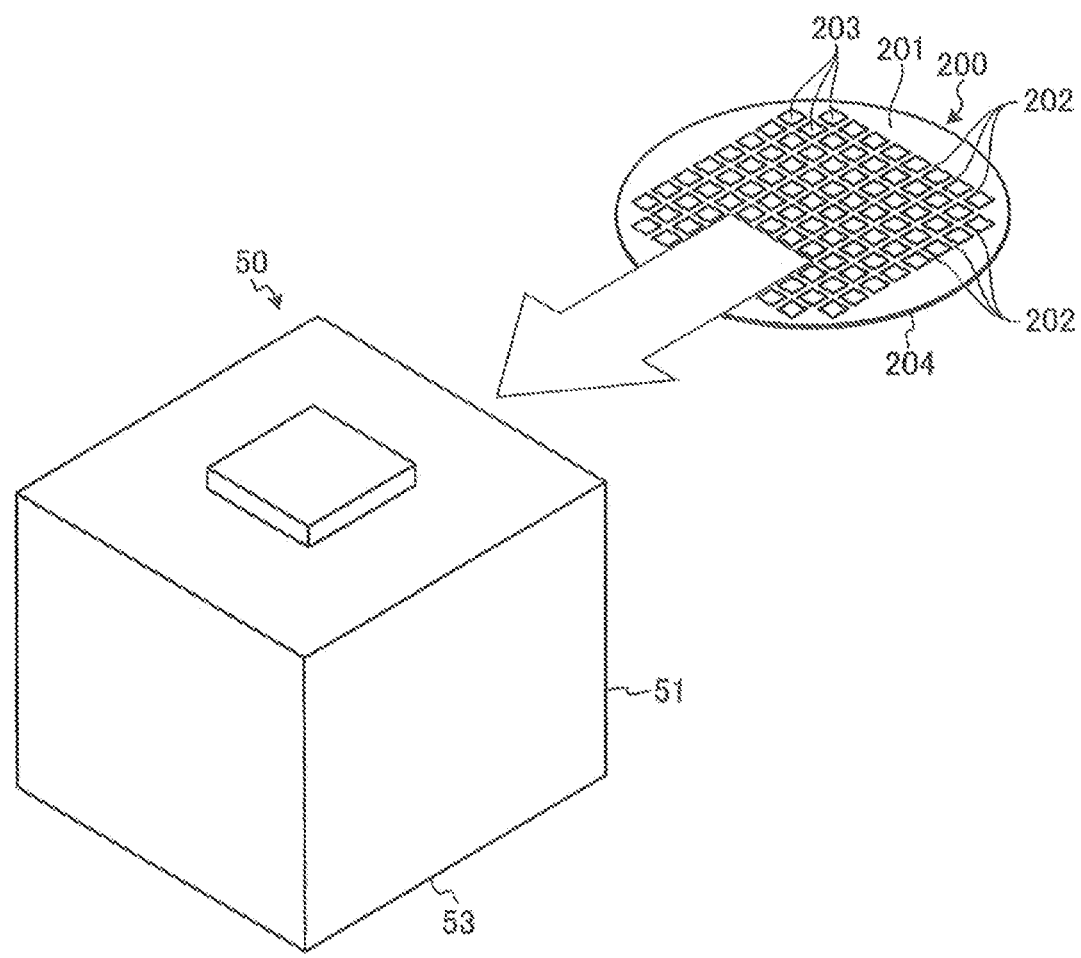
FIG. 6 is a perspective view depicting a modification of the cassette illustrated in FIG. 2.

Note that the present invention is not limited to the above-described embodiment. Specifically, the present invention can be carried out with various modifications within such ranges as not to depart from the gist of the invention. Note that, in the present invention, the cassette 50 is not limited to what is generally called the frame cassette; as depicted in FIG. 6, the cassette 50 may one that accommodates a plurality of workpieces 200 as single members not supported by the annular frame 206, or may be a FOUP cassette in which the workpiece 200 is hermetically sealed during carrying. Note that FIG. 6 is a perspective view depicting a modification of the cassette illustrated in FIG. 2. In FIG. 6, the same parts as those in the first embodiment above are denoted by the same reference symbols as used above, and descriptions thereof are omitted. The cassette 50 illustrated in FIG. 6 is what is generally called a dicing before grinding (DBG) cassette or a double slot cassette.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus to be disposed in a facility having a carrying system,
   the carrying system including
   a carrier traveling through a carrying passage disposed on a ceiling side,
   a cassette that is a non-front opening unified pod having an opening exposing a workpiece accommodated in the cassette,
   the carrier including a holding section for releasably holding the cassette that accommodates the workpiece, and lifting the holding section upward and downward to place the cassette in the processing apparatus to thereby carry the workpiece,
   the processing apparatus comprising:
   a chuck table that holds the workpiece;
   a processing unit that processes the workpiece held by the chuck table;
   a cassette placing region where the cassette is placed;
   a carrying unit that carries the workpiece between the cassette placed in the cassette placing region and the chuck table;
   a unitary main body including a ceiling wall extending uninterruptedly from an opening formed in the ceiling wall to a plurality of side walls extending downwardly from outer edges of the ceiling wall, for housing the chuck table, the processing unit, the cassette placing region, and the carrying unit; and
   an erected tube extending from the ceiling wall around the opening in the ceiling wall and configured to allow the holding section to move the cassette, with the workpiece exposed through the opening of the cassette, down into an inside of the main body through the erected tube and past the opening formed in the ceiling wall to place the cassette on, or retrieve the cassette from, a surface of the cassette placing region with the opening of the cassette workpiece exposing the workpiece to the chuck table, from an external space directly above the cassette placing region,
   wherein a height of the erected tube is higher than a height of the ceiling wall of the processing apparatus.

2. The processing apparatus according to claim 1, wherein one of the plurality of side walls includes an opening-closing door that permits an operator to enter the cassette placing region.

* * * * *